(12) United States Patent
Kim et al.

(10) Patent No.: US 10,354,740 B2
(45) Date of Patent: Jul. 16, 2019

(54) THREE-DIMENSIONAL SEMICONDUCTOR MEMORY DEVICES INCLUDING FIRST CONTACT HAVING A STEPWISE PROFILE AT INTERFACE BETWEEN TWO PORTIONS

(71) Applicant: Samsung Electronics Co., Ltd., Suwon-si, Gyeonggi-do (KR)

(72) Inventors: Kwang-Ho Kim, Suwon-si (KR); Jihwan Yu, Suwon-si (KR); Seunghyun Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/842,029

(22) Filed: Dec. 14, 2017

(65) Prior Publication Data
US 2018/0308559 A1   Oct. 25, 2018

(30) Foreign Application Priority Data

Apr. 25, 2017   (KR) ................. 10-2017-0053108

(51) Int. Cl.
| | |
|---|---|
| *G11C 19/28* | (2006.01) |
| *H01L 27/11578* | (2017.01) |
| *G11C 8/14* | (2006.01) |
| *G11C 11/412* | (2006.01) |
| *H01L 27/11565* | (2017.01) |

(Continued)

(52) U.S. Cl.
CPC ............... *G11C 19/28* (2013.01); *G11C 8/14* (2013.01); *G11C 11/412* (2013.01); *H01L 27/1157* (2013.01); *H01L 27/11565* (2013.01); *H01L 27/11573* (2013.01); *H01L 27/11575* (2013.01);

(Continued)

(58) Field of Classification Search
CPC ......... G11C 19/28; G11C 11/412; G11C 8/14; H01L 27/11578; H01L 27/11582; H01L 27/11575; H01L 27/11573
See application file for complete search history.

(56) References Cited

U.S. PATENT DOCUMENTS 7,994,072 B2   8/2011   Hohage et al.
8,084,805 B2   12/2011   Shim et al.
(Continued)

FOREIGN PATENT DOCUMENTS

| KR | 101204675 B1 | 11/2012 |
|---|---|---|
| KR | 20160059862 A | 5/2016 |
| KR | 20160090212 A | 7/2016 |

*Primary Examiner* — David Lam
(74) *Attorney, Agent, or Firm* — Harness, Dickey & Pierce, P.L.C.

(57) ABSTRACT

Disclosed is a three-dimensional semiconductor device including a stack structure on a substrate and including electrodes that are vertically stacked on top of each other on a first region of a substrate, a vertical structure penetrating the stack structure and including a first semiconductor pattern, a data storage layer between the first semiconductor pattern and at least one of the electrodes, a transistor on a second region of the substrate, and a first contact coupled to the transistor. The first contact includes a first portion and a second portion on the first portion. Each of the first portion and the second portions has a diameter that increases with an increasing vertical distance from the substrate. A diameter of an upper part of the first portion is greater than a diameter of a lower part of the second portion.

17 Claims, 17 Drawing Sheets

(51) Int. Cl.
*H01L 27/1157* (2017.01)
*H01L 27/11573* (2017.01)
*H01L 27/11575* (2017.01)
*H01L 27/11582* (2017.01)
*G11C 5/02* (2006.01)

(52) U.S. Cl.
CPC .. *H01L 27/11578* (2013.01); *H01L 27/11582* (2013.01); *G11C 5/025* (2013.01)

(56) References Cited

U.S. PATENT DOCUMENTS

| | | |
|---|---|---|
| 8,878,272 B2 | 11/2014 | Kim |
| 9,023,696 B2 | 5/2015 | Baars et al. |
| 9,263,322 B2 | 2/2016 | Chang et al. |
| 9,515,079 B2 | 12/2016 | Koka et al. |
| 9,685,235 B2 * | 6/2017 | Park ................. G11C 16/20 |
| 2012/0168858 A1 | 7/2012 | Hong |
| 2014/0264718 A1 * | 9/2014 | Wada ............. H01L 21/76808 |
| | | 257/499 |
| 2016/0027795 A1 * | 1/2016 | Jung ............. H01L 27/11575 |
| | | 257/315 |
| 2016/0141417 A1 | 5/2016 | Park et al. |
| 2016/0211363 A1 | 7/2016 | Park |

* cited by examiner under 35 U.S.C § 119 of Korean Patent Application No. 10-2017-0053108 filed on Apr. 25, 2017, the entire contents of which are hereby incorporated by reference.

THREE-DIMENSIONAL SEMICONDUCTOR MEMORY DEVICES INCLUDING FIRST CONTACT HAVING A STEPWISE PROFILE AT INTERFACE BETWEEN TWO PORTIONS

CROSS-REFERENCE TO RELATED APPLICATIONS

This U.S. nonprovisional patent application claims priority under 35 U.S.C § 119 of Korean Patent Application No. 10-2017-0053108 filed on Apr. 25, 2017, the entire contents of which are hereby incorporated by reference.

BACKGROUND

Inventive concepts relate to a semiconductor device, and more particularly, to a three-dimensional semiconductor memory device having enhanced integration.

Semiconductor devices have been highly integrated for satisfying high performance and low manufacture costs which are desired by users. Since integration of the semiconductor devices is an important factor in determining product price, high integration is increasingly demanded in particular. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Embodiments of inventive concepts relate to a three-dimensional semiconductor memory device having enhanced integration and reliability.

According to some example embodiments of inventive concepts, a three-dimensional semiconductor memory device may include a stack structure on a substrate, the stack structure include electrodes that are vertically stacked on top of each other on a first region of the substrate; a vertical structure penetrate the stack structure and including a first semiconductor pattern; a data storage layer between the first semiconductor pattern and at least one of the electrodes; a transistor on a second region of the substrate; and a first contact coupled to the transistor. The first contact may include a first portion and a second portion on the first portion. Each of the first portion and the second portion may have a diameter that increases with an increasing vertical distance from the substrate. A diameter of an upper part of the first portion may be greater than a diameter of a lower part of the second portion.

According to some example embodiments of inventive concepts, a three-dimensional semiconductor memory device may include a stack structure on a substrate, the stack structure including electrodes that are vertically stacked on top of each other on a first region of the substrate; a channel structure penetrating the stack structure; a transistor on a second region of the substrate; an interlayer dielectric layer on the stack structure and the transistor; a first contact penetrating the interlayer dielectric layer, the first contact coupled to the transistor; and a second contact penetrating the interlayer dielectric layer, the second contact coupled to at least one of the electrodes of the stack structure. A sidewall of the first contact may have a stepwise profile. A sidewall of the second contact may have a continuous profile.

According to some example embodiments of inventive concepts, a three-dimensional semiconductor memory device may include: a substrate including a cell array region and a peripheral circuit region; a stack structure on the cell array region; a transistor on the peripheral circuit region; a first contact electrically connected to the transistor; and a second contact electrically connected to the stack structure. The stack structure may include a memory cell array having a plurality of memory cells that are vertically stacked. The stack structure may include word lines electrically connected to the plurality of memory cells. A sidewall of the second contact may have a different profile than a sidewall of the first contact.

DETAILED DESCRIPTION

Figure 1:
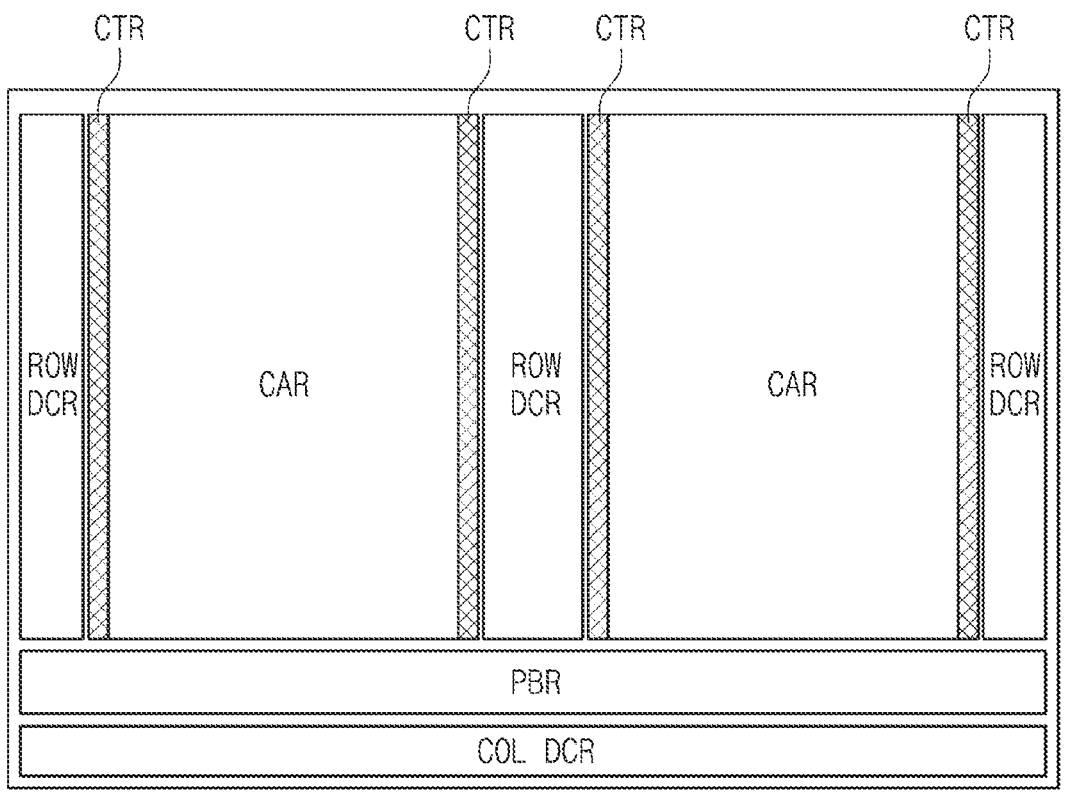
FIG. 1 is a schematic diagram for explaining a simplified configuration of a three-dimensional semiconductor memory device according to some example embodiments of inventive concepts.

FIG. 1 is a schematic diagram for explaining a simplified configuration of a three-dimensional semiconductor memory device according to some example embodiments of inventive concepts.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region (not shown). In some embodiments, a connection region CTR may be disposed between the cell array region CAR and the row decoder region ROW DCR.

The cell array region CAR may include a memory cell array that includes (or consists of) a plurality of memory cells. In some embodiments, the memory cell array may include three-dimensionally arranged memory cells and a plurality of word lines and bit lines electrically connected to the memory cells.

The row decoder region ROW DCR may be provided with a row decoder that selects the word lines of the memory cell array, and the connection region CTR may be provided with a wiring structure that electrically connects the memory cell array and the row decoder to each other. The row decoder may select one of the word lines of the memory cell array in accordance with address information. The row decoder may provide word line voltages to the selected word line and unselected word lines in response to a control signal from a control circuit.

The page buffer region PBR may be provided with a page buffer that reads data stored in the memory cells. Depending on an operating mode, the page buffer may temporarily store data to be stored in the memory cells or sense data stored in the memory cells. The page buffer may function as a write driver circuit in a program operating mode and as a sense amplifier circuit in a read operating mode.

The column decoder region COL DCR may be provided with a column decoder connected to the bit lines of the memory cell array. The column decoder may provide a data transmission path between the page buffer and an external device (e.g., a memory controller).

Figure 2:
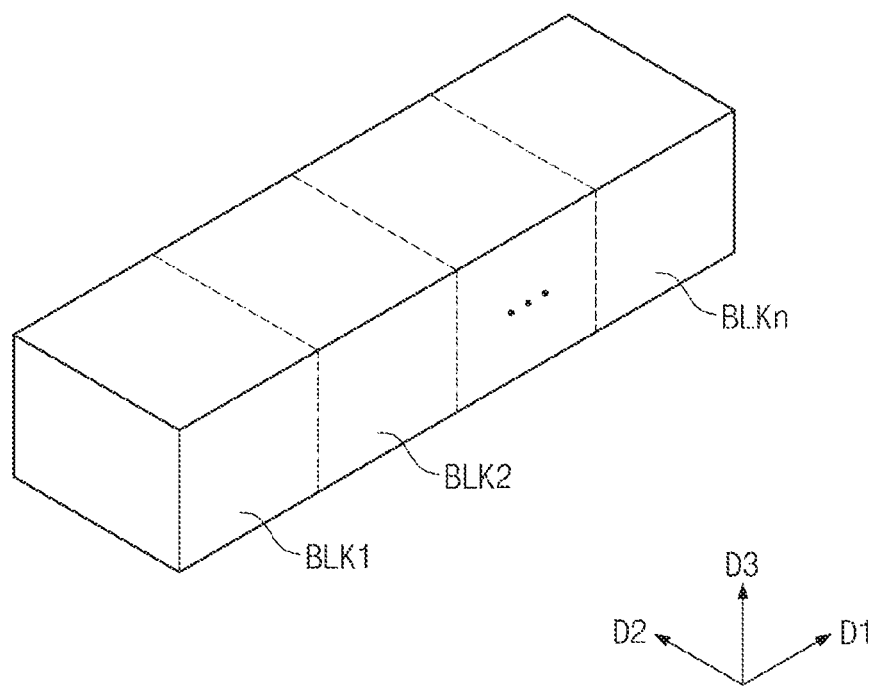
FIG. 2 is a simplified block diagram illustrating a cell array of a three-dimensional semiconductor memory device according to some example embodiments of inventive concepts.

FIG. 2 is a simplified block diagram illustrating a cell array of a three-dimensional semiconductor memory device according to some example embodiments of inventive concepts.

Referring to FIG. 2, a cell array region CAR may include a plurality of cell array blocks BLK1, BLK2, . . . , and BLKn. Each of the cell array blocks BLK1, BLK2, . . . , and BLKn may include a stack structure having electrodes stacked along a third direction D3 on a plane extending along first and second directions D1 and D2. The stack structure may combine with a plurality of vertical structures (or semiconductor pillars) to constitute three-dimensionally arranged memory cells. In addition, each of the cell array blocks BLK1, BLK2, . . . om and BLKn may include bit lines electrically connected to the memory cells.

Figure 3:
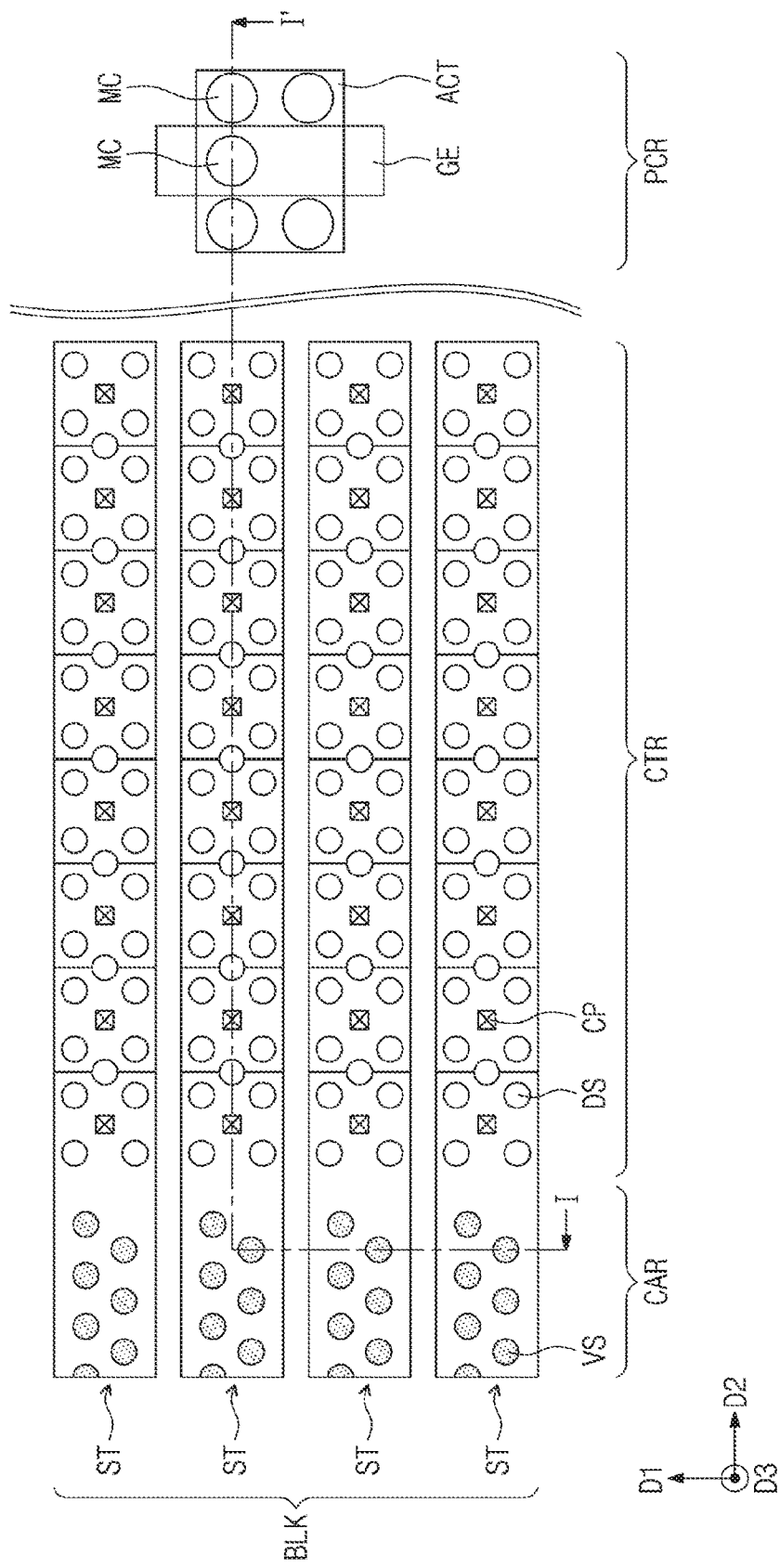
FIG. 3 is a plan view of a three-dimensional semiconductor memory device according to some example embodiments of inventive concepts.
Figure 4:
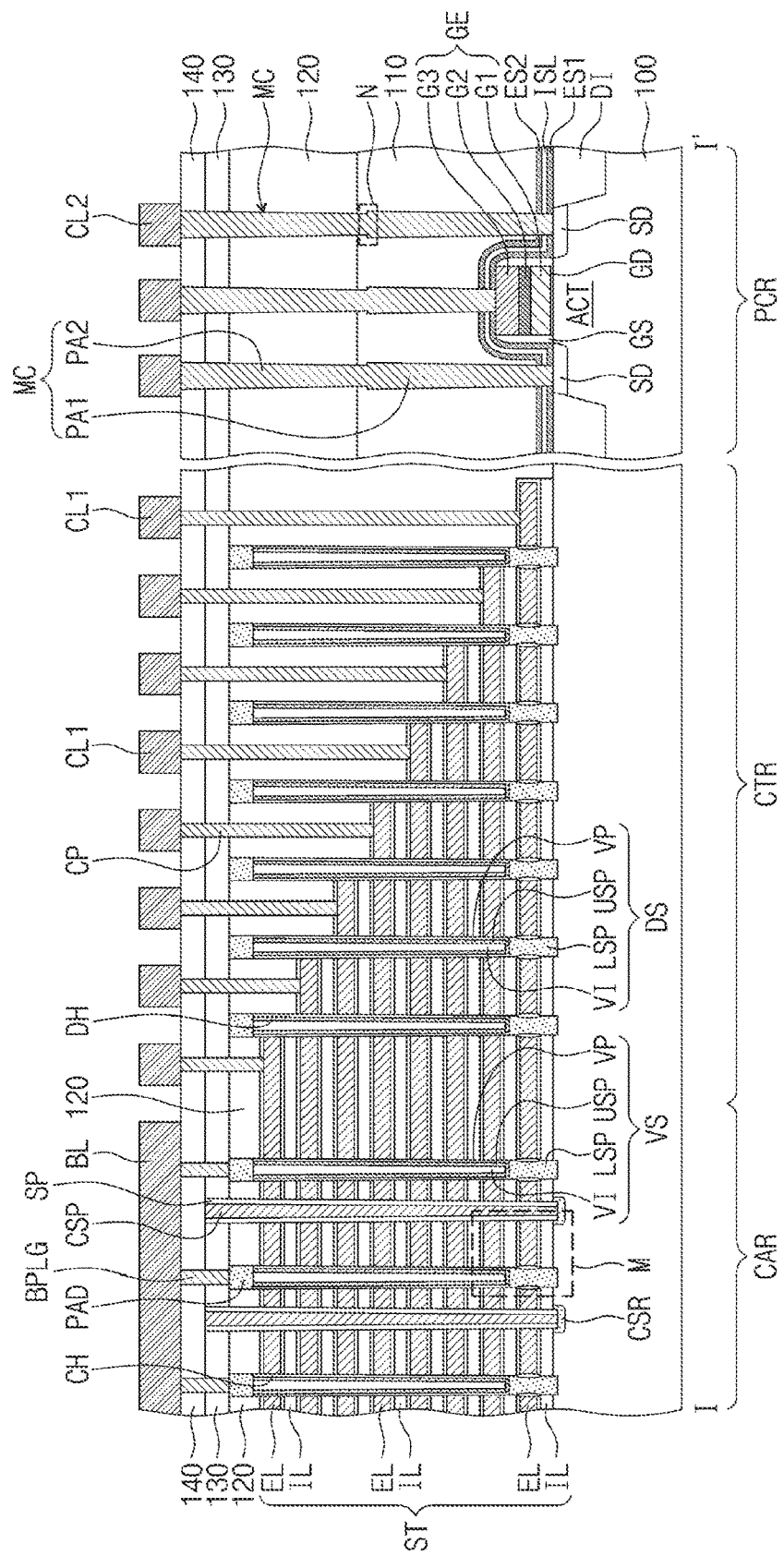
FIG. 4 is a cross-sectional view taken along line I-I' of FIG. 3.
Figure 5:
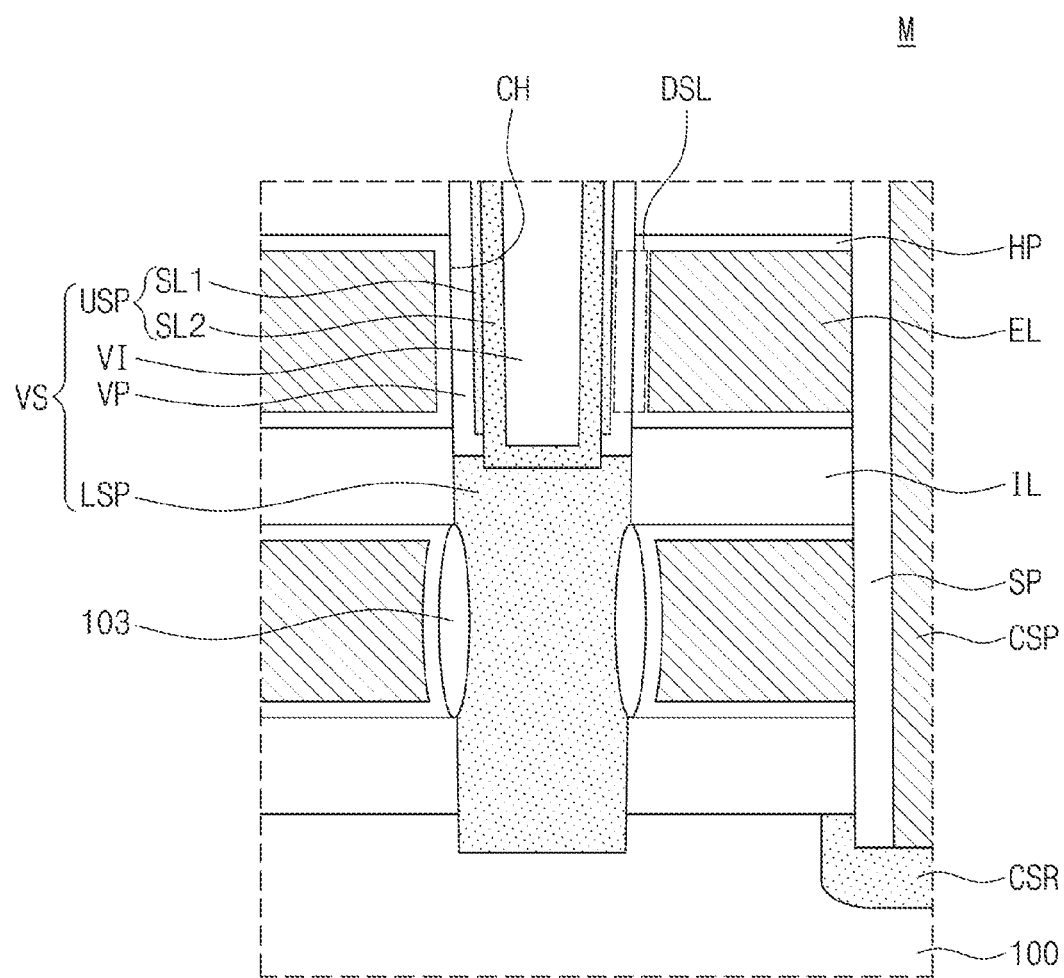
FIG. 5 is an enlarged cross-sectional view of section M shown in FIG. 4.
Figure 6:
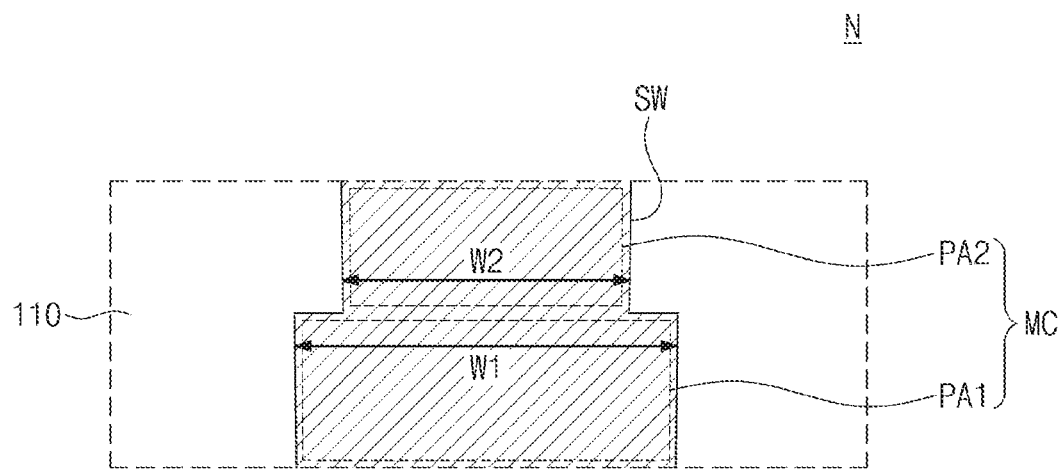
FIG. 6 is an enlarged cross-sectional view of section N shown in FIG. 4.

FIG. 3 is a plan view of a three-dimensional semiconductor memory device according to some example embodiments of inventive concepts. FIG. 4 is a cross-sectional view taken along line I-I' of FIG. 3. FIG. 5 is an enlarged view of section M shown in FIG. 4. FIG. 6 is an enlarged cross-sectional view of section N shown in FIG. 4.

Referring to FIGS. 3 to 6, a substrate 100 may be provided thereon with a cell array region CAR, a connection region CTR, and a peripheral circuit region PCR. The connection region CTR may be positioned between the cell array region CAR and the peripheral circuit region PCR. For example, the substrate 100 may be a semiconductor substrate, such as a silicon substrate, a germanium substrate, or a silicon-germanium substrate. The substrate 100 may have a first conductivity. For example, the substrate 100 may have a p-type conductivity.

Peripheral logic circuits may be provided on the peripheral circuit region PCR of the substrate 100. For example, at least one peripheral transistor may be provided on the peripheral circuit region PCR. The peripheral transistor may include an active region ACT and a peripheral gate electrode GE. The active region ACT may be defined by a device isolation layer DI provided on the peripheral circuit region PCR. The peripheral gate electrode GE may be provided to cross over the active region ACT. The peripheral gate electrode GE may include a first gate layer G1, a second gate layer G2, and a third gate layer G3 that are sequentially stacked on the substrate 100. A gate dielectric layer GD may be interposed between the peripheral gate electrode GE and the substrate 100.

The gate dielectric layer GD may include silicon oxide and/or a high-k dielectric material (e.g., a material have a higher dielectric constant than silicon oxide). For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. For example, the first gate layer G1 may include polysilicon, the second gate layer G2 may include metal silicide (e.g., tungsten silicide, molybdenum silicide, etc.), and third gate layer G3 may include metal (e.g., tungsten, molybdenum, etc.).

Gate spacers GS may be provided to cover opposite sidewalls of the peripheral gate electrode GE. For example, the gate spacers GS may include one or more of a silicon nitride layer, a silicon oxynitride layer, and a silicon oxide layer. The active region ACT may include source/drain regions SD adjacent to opposite sides of the peripheral gate electrode GE.

The peripheral circuit region PCR may be provided thereon with a first etch stop layer ES1, a buffer layer ISL, and a second etch stop layer ES2 that are sequentially stacked. The first etch stop layer ES1, the buffer layer ISL, and the second etch stop layer ES2 may conformally cover the peripheral gate electrode GE, the gate spacers GS, and the source/drain regions SD. The second etch stop layer ES2 may have a top surface, whose level is higher on the peripheral gate electrode GE than on the source/drain regions SD. The first and second etch stop layers ES1 and ES2 may include the same material or different materials from each other. For example, the first and second etch stop layers ES1 and ES2 may include, independently of each other, one or more of a silicon nitride layer, a silicon oxynitride layer, and a polysilicon layer. The buffer layer ISL may include a material, for example, a silicon oxide layer, having an etch selectivity to the first and second etch stop layers ES1 and ES2.

A first interlayer dielectric layer 110 may be provided on the peripheral circuit region PCR. The first interlayer dielectric layer 110 may cover the second etch stop layer ES2. The first interlayer dielectric layer 110 may be provided restrictedly on the peripheral circuit region PCR. In other words, the first interlayer dielectric layer 110 may not be provided on the cell array region CAR and the connection region CTR.

A cell array block BLK may be disposed on the substrate 100. The cell array block BLK may include stack structures ST in each of which insulation layers IL and electrodes EL are vertically and alternately stacked. The stack structures ST may extend from the cell array region CAR toward the connection region CTR along a second direction D2. The stack structures ST may be arranged along a first direction D1 crossing the second direction D2.

Common source regions CSR may be provided on the cell array region CAR. The common source regions CSR may be disposed in the substrate 100 between the stack structures ST horizontally adjacent to each other. The common source regions CSR may extend parallel to the stack structures ST along the second direction D2. The common source regions CSR may be arranged along the first direction D1. The common source regions CSR may be doped with an impurity with a second conductivity. For example, the common source regions CSR may be doped with an impurity such as arsenic (As) or phosphorous (P) with an n-type conductivity.

A common source plug CSP may be coupled to the common source region CSR. The common source plug CSP may extend parallel to the stack structures ST along the second direction D2. Insulation spacers SP may be interposed between the common source plug CSP and the stack structures ST.

The electrodes EL of each stack structure ST may be stacked along a third direction D3 perpendicular to a top surface of the substrate 100. The electrodes EL may be vertically spaced apart from each other by the insulation layers IL disposed therebetween. The electrodes EL may have a stepwise structure on the connection region CTR. For example, the stack structure ST may have on the connection region CTR a height that decreases with increasing distance from the cell array region CAR.

A lowermost electrode EL of the stack structure ST may be a lower select line. An uppermost electrode EL of the stack structure ST may be an upper select line. Other electrodes EL except the lower and upper select lines may be word lines. For example, the electrodes EL may include one or more of doped semiconductor (e.g., doped silicon, etc.), metal (e.g., tungsten, copper, aluminum, etc.), conductive metal nitride (e.g., titanium nitride, tantalum nitride, etc.), and transition metal (e.g., titanium, tantalum, etc.). The insulation layers IL may include a silicon oxide layer.

The electrodes EL may have on the connection region CTR their planar areas that decrease with increasing distance in the third direction D3 from the top surface of the substrate 100. The lowermost electrode EL (e.g., the lower select line) of the stack structure ST may have the greatest planar area. The uppermost electrode EL (e.g., the upper select line) of the stack structure ST may have the smallest planar area.

The stack structure ST may be penetrated with a plurality of channel holes CH on the cell array region CAR. Vertical structures VS may be provided in the channel holes CH. As viewed in plan, the vertical structures VS may be arranged along the second direction D2. For example, the vertical structures VS may be arranged in a zigzag fashion along the second direction D2. Alternatively, although not shown, the vertical structures VS may be arranged in a straight line along the second direction D2. The vertical structure VS may have a cylindrical shape. Each of the vertical structures VS may have a diameter, which gradually increases with increasing distance (e.g., in the third direction D3) from the substrate 100.

Each of the vertical structures VS may include a vertical insulation layer VP, an upper semiconductor pattern USP, a lower semiconductor pattern LSP, and a buried insulation pattern VI. The vertical insulation layer VP may extend toward the substrate 100 along an inner sidewall of the channel hole CH. The upper semiconductor pattern USP may cover an inner sidewall of the vertical insulation layer VP and extend together with the vertical insulation layer VP toward the substrate 100.

Referring back to FIG. 5, the lower semiconductor pattern LSP may be provided in a lower portion of the channel hole CH and in direct contact with the substrate 100. The lower semiconductor pattern LSP may have a solid cylindrical shape. For example, differently from the upper semiconductor pattern USP, the lower semiconductor pattern LSP may fill the lower portion of the channel hole CH without the buried insulation pattern VI. The lower semiconductor pattern LSP may penetrate the lowermost electrode EL (e.g., the lower select line) of the stack structure ST. An oxidation pattern 103 may be interposed between the lower semiconductor pattern LSP and the lowermost electrode EL (e.g., the lower select line).

The upper semiconductor pattern USP may include a first semiconductor pattern SL1 and a second semiconductor pattern SL2. The second semiconductor pattern SL2 may be in direct contact with the lower semiconductor pattern LSP. The second semiconductor pattern SL2 may have a macaroni or pipe shape whose bottom end is closed. The second semiconductor pattern SL2 may have an inside filled with the buried insulation pattern VI. The second semiconductor pattern SL2 may be in contact with an inner sidewall of the first semiconductor pattern SL1. The second semiconductor pattern SL2 may electrically connect the first semiconductor pattern SL1 to the lower semiconductor pattern LSP. The first semiconductor pattern SL1 may have a macaroni or pipe shape whose top and bottom ends are opened. The first semiconductor pattern SL1 may be spaced apart from the lower semiconductor pattern LSP without being in direct contact therewith. The lower and upper semiconductor patterns LSP and USP may be used as a channel of a three-dimensional semiconductor memory device according to some example embodiments of inventive concepts.

For example, the lower and upper semiconductor patterns LSP and USP may include silicon, germanium, or silicon-germanium. The lower and upper semiconductor patterns LSP and USP may have the same crystal structure or different crystal structures from each other. The lower and upper semiconductor patterns LSP and USP may have, independently of each, at least one selected from a single crystalline structure, an amorphous structure, and a poly-crystalline structure. The lower and upper semiconductor patterns LSP and USP may be either undoped or doped with an impurity so as to have the same first conductivity as that of the substrate 100.

Horizontal insulation layers HP may be interposed between the electrodes EL and the vertical structures VS. A data storage layer DSL may be constituted by the horizontal and vertical insulation layers HP and VP that are interposed between the electrode EL and the upper semiconductor pattern USP.

A NAND Flash memory device may be adopted as a three-dimensional semiconductor memory device according to some example embodiments of inventive concepts. For example, the data storage layer DSL interposed between the electrode EL and the upper semiconductor pattern USP may include a tunnel insulation layer, a charge storage layer, and a blocking insulation layer. The tunnel insulation layer may be in direct contact with the upper semiconductor pattern USP. The blocking insulation layer may be in direct contact with the electrode EL. The charge storage layer may be interposed between the tunnel insulation layer and the blocking insulation layer. Data stored in the data storage layer DSL may be changed by Fouler-Nordheim tunneling induced by a voltage difference between the electrode EL and the upper semiconductor pattern USP.

The tunnel insulation layer may include a material having a band gap wider than that of the charge storage layer. The tunnel insulation layer may include a silicon oxide layer or a high-k dielectric layer such as an aluminum oxide layer and a hafnium oxide layer. The charge storage layer may include a silicon nitride layer, a silicon oxynitride layer, or a silicon-rich nitride layer. The blocking insulation layer may include a silicon oxide layer.

In some embodiments, the vertical insulation layer VP may include the tunnel insulation layer, and the horizontal insulation layer HP may include the blocking insulation layer. The charge storage layer may be included in one of the vertical and horizontal insulation layers VP and HP, but not especially limited thereto.

Referring back to FIGS. 3 and 4, the electrodes EL of the stack structure ST may be coupled to cell contacts CP on the connection region CTR. For example, the number of the cell contacts CP connected to the stack structure ST may be the same as the number of the electrodes EL constituting the stack structure ST. The cell contacts CP may be arranged spaced apart from each other along the second direction D2. Since the electrodes EL have the stepwise structure on the connection region CTR, the cell contacts CP may have bottom surfaces positioned at different heights from the substrate 100. The bottom surfaces of the cell contacts CP may have levels that decrease with increasing distance from the cell array region CAR. Each of the cell contacts CP may have a sidewall having a continuous profile. In other words, each of the cell contacts CP may have a diameter that does not change discontinuously (or abruptly) at a specific position.

The stack structure ST may be penetrated with a plurality of dummy holes DH on the connection region CTR. Dummy structures DS may be provided in the dummy holes DH. The dummy structures DS may be selectively provided only on the connection region CTR and not on the cell array region CAR. The dummy structures DS may be disposed adjacent to and spaced apart from the cell contacts CP. The dummy structures DS may physically support the stack structure ST on the connection region CTR. In some embodiments, identically or similarly to the vertical structure VS, each of the dummy structures DS may include a vertical insulation layer VP, an upper semiconductor pattern USP, a lower semiconductor pattern LSP, and a buried insulation pattern VI.

The dummy structure DS may have a cylindrical shape. Each of the dummy structures DS may have a diameter, which gradually increases with increasing distance (e.g., in the third direction D3) from the substrate 100. For example, a maximum diameter of the dummy structure DS may be substantially the same as a maximum diameter of the vertical structure VS. Alternatively, the maximum diameter of the dummy structure DS may be greater than the maximum diameter of the vertical structure VS. Dissimilarly, the maximum diameter of the dummy structure DS may be less than the maximum diameter of the vertical structure VS.

The stack structures VS may be coupled to bit line contact plugs BPLG on the cell array region CAR. The contact plugs BPLG may be in direct contact with pads PAD provided at or on the vertical structures VS. The contact plugs BPLG may be electrically connected through the pads PAD to the upper semiconductor patterns USP of the vertical structures VS.

The substrate 100 may be provided on its entire surface with a second interlayer dielectric layer 120 covering the stack structures ST and the first interlayer dielectric layer 110. The second interlayer dielectric layer 120 may have a planarized top surface. A third interlayer dielectric layer 130 and a fourth interlayer dielectric layer 140 may be sequentially disposed on the second interlayer dielectric layer 120.

The source/drain regions SD and the peripheral gate electrode GE may be coupled to peripheral contacts MC, which lie on the peripheral circuit region PCR and penetrate the first to fourth interlayer dielectric layers 110, 120, 130, and 140. The peripheral contacts MC may be in direct contact with the source/drain regions SD and the peripheral electrode GE, while penetrating the first etch stop layer ES1, the buffer layer ISL, and the second etch stop layer ES2. The peripheral contact MC may have a cylindrical shape. The peripheral contact MC coupled to the peripheral gate electrode GE may have a bottom surface whose level is higher than those of bottom surfaces of the peripheral contacts MC coupled to the source/drain regions SD.

Referring back to FIGS. 4 and 6, each of the peripheral contacts MC may include a first portion PA1 and a second portion PA2 on the first portion PA1. The first portion PA1 may have a diameter that gradually increases with increasing distance (e.g., in the third direction D3) from the substrate 100. Likewise, the second portion PA2 may have a diameter that gradually increases with increasing distance (e.g., in the third direction D3) from the substrate 100. An upper part of the first portion PA1 may have a diameter W1 greater than a diameter W2 of a lower part of the second portion PA2.

A diameter of the peripheral contact MC may be discontinuously (or abruptly) changed at an interface between the first portion PA1 and the second portion PA2. To put it another way, the first and second portions PA1 and PA2 may have their diameters adjoining the interface, and the diameter (e.g., W1) of the first portion PA1 may be greater than the diameter (e.g., W2) of the second portion PA2. The peripheral contact MC may have a sidewall SW having a discontinuous profile. The sidewall SW of the peripheral contact MC may have a stepwise profile at the interface between the first portion PA1 and the second portion PA2. The interface between the first and second portions PA1 and PA2 may be lower than an interface between the first and second interlayer dielectric layers 110 and 120.

A maximum diameter (e.g., W1) of each peripheral contact MC may be greater than a maximum diameter of each cell contact CP. The maximum diameter (e.g., W1) of each peripheral contact MC may be greater than a maximum diameter of each bit line contact plug BPLG. The peripheral contact MC may have a discontinuous sidewall profile between the first portion PA1 and the second portion PA2. In contrast, each of the cell contact CP and the bit line contact plug BPLG may have a continuous sidewall profile. Accordingly, the peripheral contact MC may have a different shape from those of the cell contact CP and the bit line contact plug BPLG.

Referring back to FIGS. 3 and 4, the cell contacts CP, the bit line contact plugs BPLG, and the peripheral contacts MC may include the same conductive material. For example, the cell contacts CP, the bit line contact plugs BPLG, and the peripheral contacts MC may include one or more of metal (e.g., tungsten, copper, aluminum, etc.), conductive metal nitride (e.g., titanium nitride, tantalum nitride, etc.), and transition metal (e.g., titanium, tantalum, etc.), and/or combinations thereof.

The fourth interlayer dielectric layer 140 may be provided thereon with bit lines BL that cross over the stack structures ST and extend in the first direction D1. Each of the bit lines BL may be electrically connected through bit line contact plugs BPLG to the vertical structure VS. The fourth interlayer dielectric layer 140 may also be provided thereon with first electrical lines CL1 connected to the cell contacts CP. The fourth interlayer dielectric layer 140 may further be provided thereon with second electrical lines CL2 connected to the peripheral contacts MC. The dummy structures DS may not be electrically connected to all of the bit lines BL and the first and second electrical lines CL1 and CL2.

A three-dimensional semiconductor memory device according to some example embodiments of inventive concepts may be configured to limit and/or prevent a disconnection between the source/drain region SD and the peripheral contact MC on the peripheral circuit region PCR. In detail, the peripheral contact MC may be constructed such that the first portion PA1 in contact with the source/drain region SD is integrally connected to the second portion PA2 in contact with the second electrical line CL2. As a result, the peripheral contact MC may stably connect the second electrical line CL2 to the source/drain region SD.

FIGS. 7 to 15 are cross-sectional views taken along line I-I' of FIG. 3 for explaining a method of fabricating a three-dimensional semiconductor memory device according to some example embodiments of inventive concepts.

Figure 7:
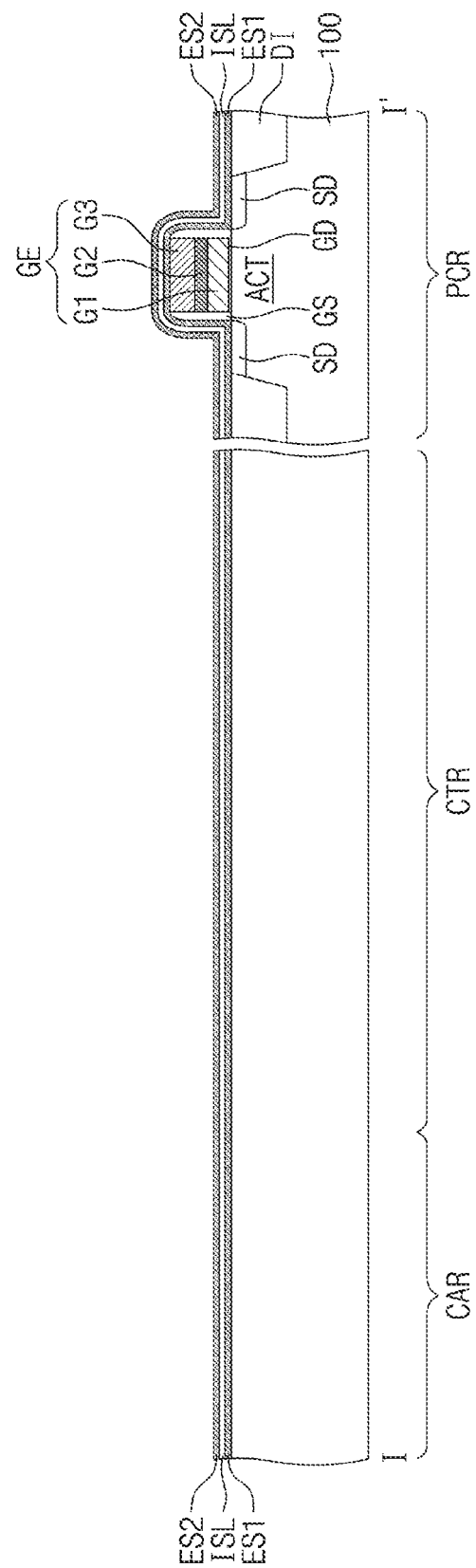
FIGS. 7 to 15 are cross-sectional views taken along line I-I' of FIG. 3 for explaining a method of fabricating a three-dimensional semiconductor memory device according to some example embodiments of inventive concepts.

Referring to FIGS. 3 and 7, peripheral logic circuits may be formed on a peripheral circuit region PCR of a substrate 100. In detail, a device isolation layer DI may be formed to define an active region ACT. A gate dielectric layer GD may be formed on the active region ACT, and a peripheral gate electrode GE may be formed on the gate dielectric layer GD. Gate spacers GS may be provided to cover opposite sidewalls of the peripheral gate electrode GE. The active region ACT may be doped with an impurity on its upper portion on opposite sides of the peripheral gate electrode GE to form source/drain regions SD. The formation of the peripheral gate electrode GE may include forming a first gate layer G1 containing polysilicon, forming on the first gate layer G1 a third gate layer G3 containing metal (e.g., tungsten, molybdenum, etc.), and reacting the first and third gate layers G1 and G3 to form a second gate layer G2 containing metal silicide.

A first etch stop layer ES1, a buffer layer ISL, and a second etch stop layer ES2 may be sequentially formed on an entire surface of the substrate 100. The first etch stop layer ES1, the buffer layer ISL, and the second etch stop layer ES2 may be formed to conformally cover the peripheral gate electrode GE, the gate spacers GS, and the source/drain regions SD. The first and second etch stop layers ES1 and ES2 may be, independently of each other, formed of a silicon nitride layer or a silicon oxynitride layer. The buffer layer ISL may be formed of a material, for example, a silicon oxide layer, having an etch selectivity to the first and second etch stop layers ES1 and ES2.

Figure 8:
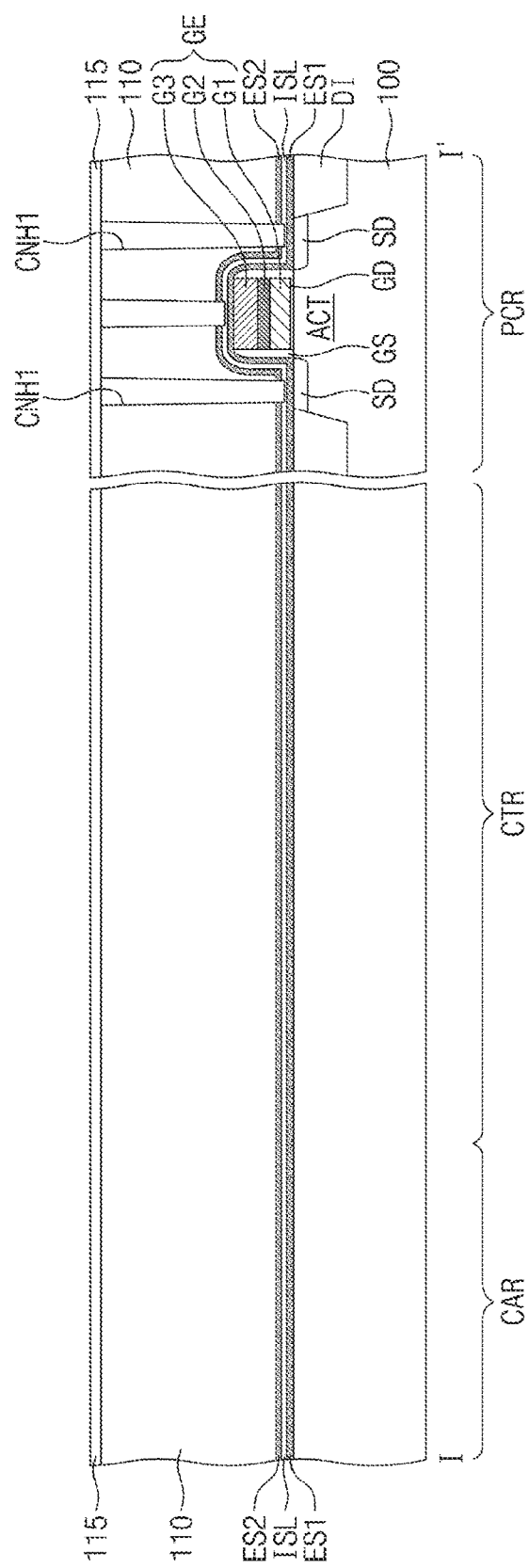

Referring to FIGS. 3 and 8, a first interlayer dielectric layer 110 may be formed on the substrate 100. First contact holes CNH1 may be formed on the peripheral circuit region PCR to penetrate the first interlayer dielectric layer 110. The first contact holes CNH1 may penetrate the second etch stop layer ES2 but not completely penetrate the buffer layer ISL. The first etch stop layer ES1 may not be exposed through the first contact holes CNH1. For example, each of the first contact holes CNH1 may have a floor surface higher than a top surface of its adjacent first etch stop layer ES1. Each of the first contact holes CNH1 may be formed to have a diameter that gradually increases with increasing distance (e.g., in a third direction D3) from the substrate 100.

An additional insulation layer 115 may be formed on the first interlayer dielectric layer 110 in which the first contact holes CNH1 are formed. The additional insulation layer 115 may be formed by a deposition process exhibiting a poor step coverage. Accordingly, each of the first contact holes CNH1 may remain as an empty space. A planarization process may be performed to cause the additional insulation layer 115 to have a planarized top surface. Hereinafter, the first interlayer dielectric layer 110 and the additional insulation layer 115 may be regarded as a single first interlayer dielectric layer 110.

Figure 9:
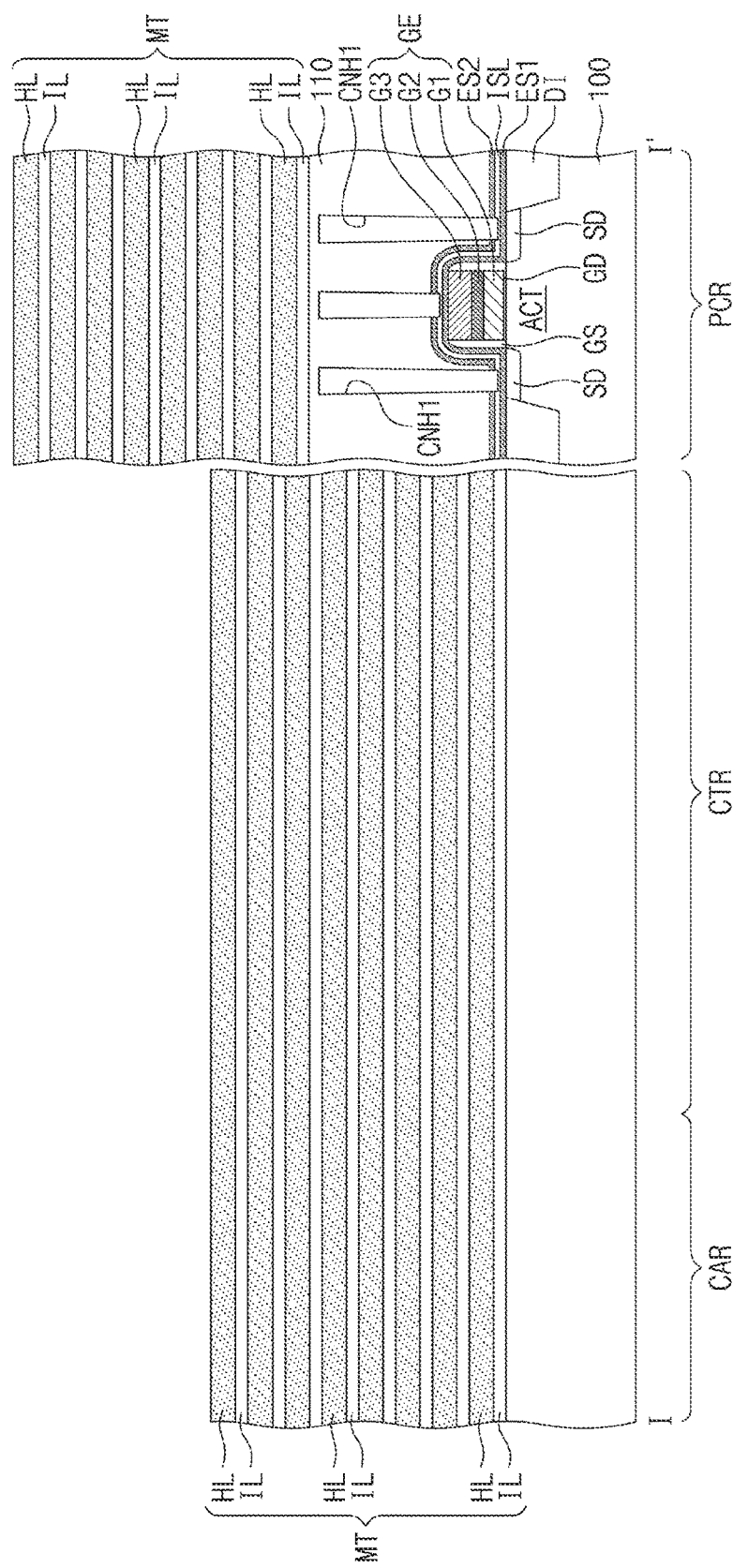

Referring to FIGS. 3 and 9, the first etch stop layer ES1, the buffer layer ISL, and the second etch stop layer ES2 may be removed from a cell array region CAR and a connection region CTR, such that a top surface of the substrate 100 may be exposed on the cell array region CAR and the connection region CTR. In detail, a hard mask (not shown) may be formed to selectively cover the peripheral circuit region PCR, and then the hard mask may be used as an etch mask to remove all layers on the cell array region CAR and the connection region CTR.

Insulation layers IL and sacrificial layers HL may be vertically and alternately stacked to form a mold structure MT on the entire surface of the substrate 100. The insulation layers IL and the sacrificial layers HL may be deposited using thermal chemical vapor deposition (CVD), plasma enhanced CVD, physical CVD process, or atomic layer deposition (ALD). The insulation layers IL may be formed of a silicon oxide layer, and the sacrificial layers HL may be formed of a silicon nitride layer or a silicon oxynitride layer.

On the peripheral circuit region PCR, the mold structure MT may be formed on the first interlayer dielectric layer 110. The mold structure MT may have a top surface, whose level is higher on the peripheral circuit region PCR than on the cell array region CAR and the connection region CTR.

Figure 10:
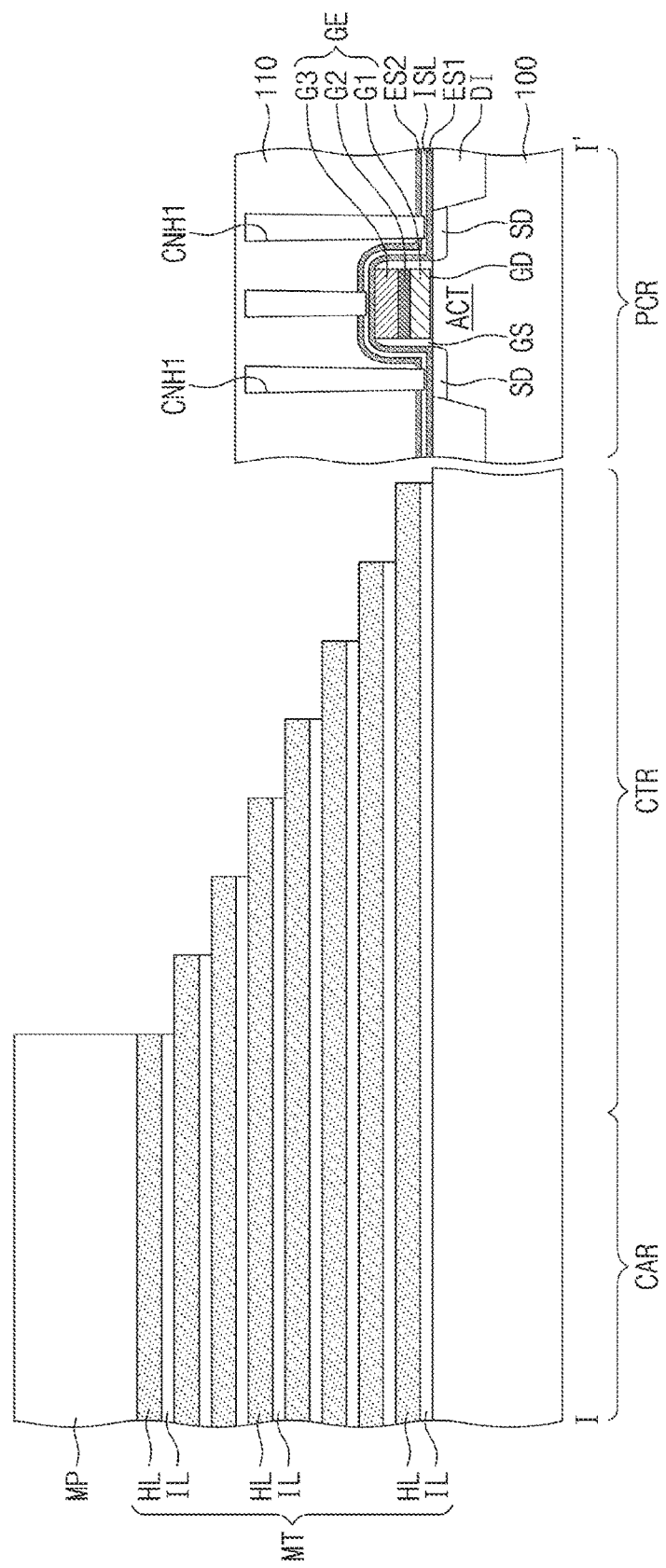

Referring to FIGS. 3 and 10, the mold structure MT may be formed to have a stepwise structure on the connection region CTR. In detail, a mask pattern MP may be formed on the mold structure MT on the cell array region CAR and the connection region CTR. The mask pattern MP may partially expose the mold structure MT on the connection region CTR. The mask pattern MP may completely expose the mold structure MT on the peripheral circuit region PCR.

The stepwise structure may be formed by alternately and repeatedly performing an etching process in which the mask pattern MP is used as an etch mask to etch a portion of the mold structure MT and a trimming process in which the mask pattern MP is reduced. The etching process for etching a portion of the mold structure MT may include etching a plurality of the sacrificial layers HL exposed through the mask pattern MP. An etching depth of the etching process may correspond to a pitch between the sacrificial layers HL vertically adjacent to each other. The trimming process may move a sidewall of the mask pattern MP in a horizontal direction at a desired (and/or alternatively predetermined) distance to reduce a planar area of the mask pattern MP.

The etching and trimming processes may be repeatedly performed until etching lowermost ones of the sacrificial and insulation layers HL and IL of the mold structure MT. When the etching and trimming processes are repeatedly performed, the peripheral circuit region PCR may undergo a complete removal of the mold structure MT entirely exposed through the mask pattern MP.

Figure 11:
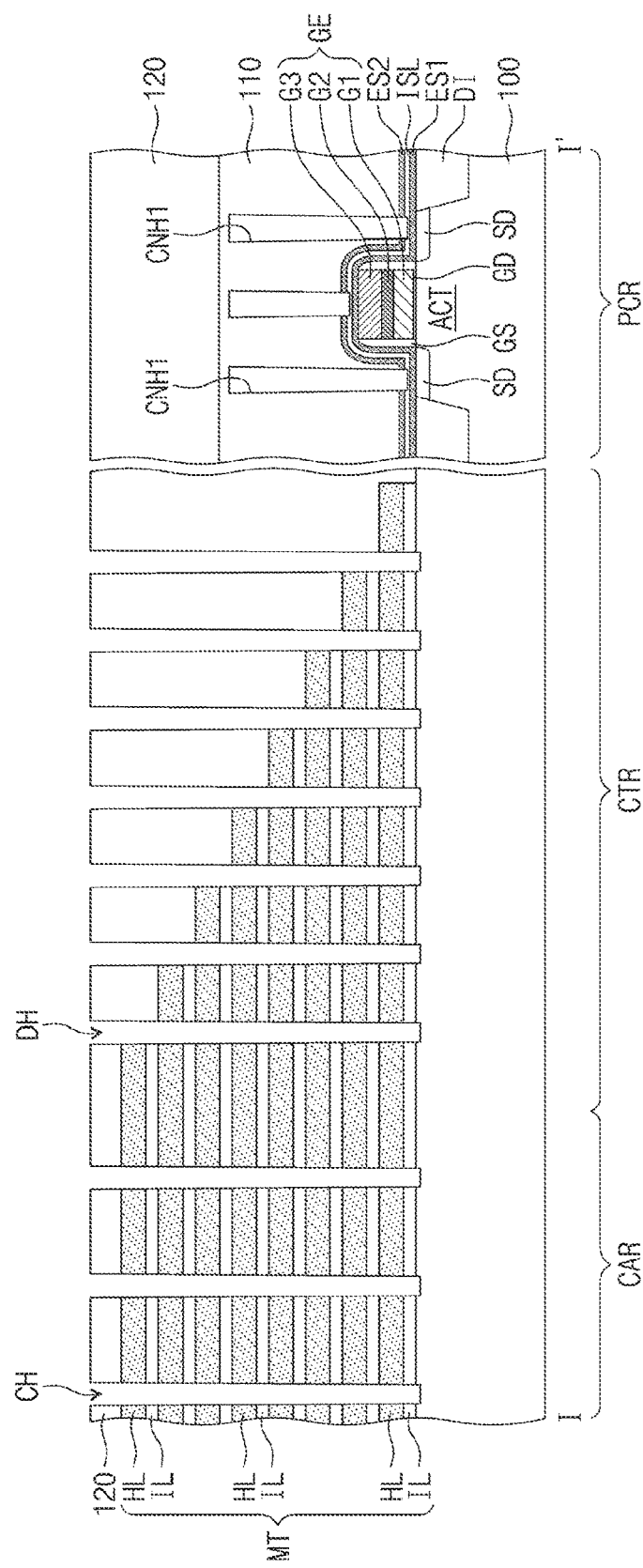

Referring to FIGS. 3 and 11, a second interlayer dielectric layer 120 may be formed on the entire surface of the substrate 100 to cover the mold structure MT and the first interlayer dielectric layer 110. The mask pattern MP may be removed before forming the second interlayer dielectric layer 120.

On the connection region CTR, a plurality of dummy holes DH may be formed to penetrate the second interlayer dielectric layer 120 and the mold structure MT. Each of the dummy holes DH may have a diameter that gradually increases with increasing distance (e.g., in the third direction D3) from the substrate 100. On the cell array region CAR, a plurality of channel holes CH may be formed to penetrate the second interlayer dielectric layer 120 and the mold structure MT. Each of the channel holes CH may have a diameter that gradually increases with increasing distance (e.g., in the third direction D3) from the substrate 100.

The channel holes CH and the dummy holes DH may be formed at the same time. In detail, the formation of the channel holes CH and the dummy holes DH may include forming on the mold structure MT a hard mask pattern (not shown) having openings that define areas where the channel holes CH and the dummy holes DH are formed and then performing an etching process on the second interlayer dielectric layer 120 and the mold structure MT using the hard mask pattern as an etch mask. After the channel holes CH and the dummy holes DH are formed, the hard mask pattern may be removed. For example, the substrate 100 may be over-etched on its top surface during the etching process. Accordingly, an upper portion of the substrate 100 may be recessed.

Figure 12:
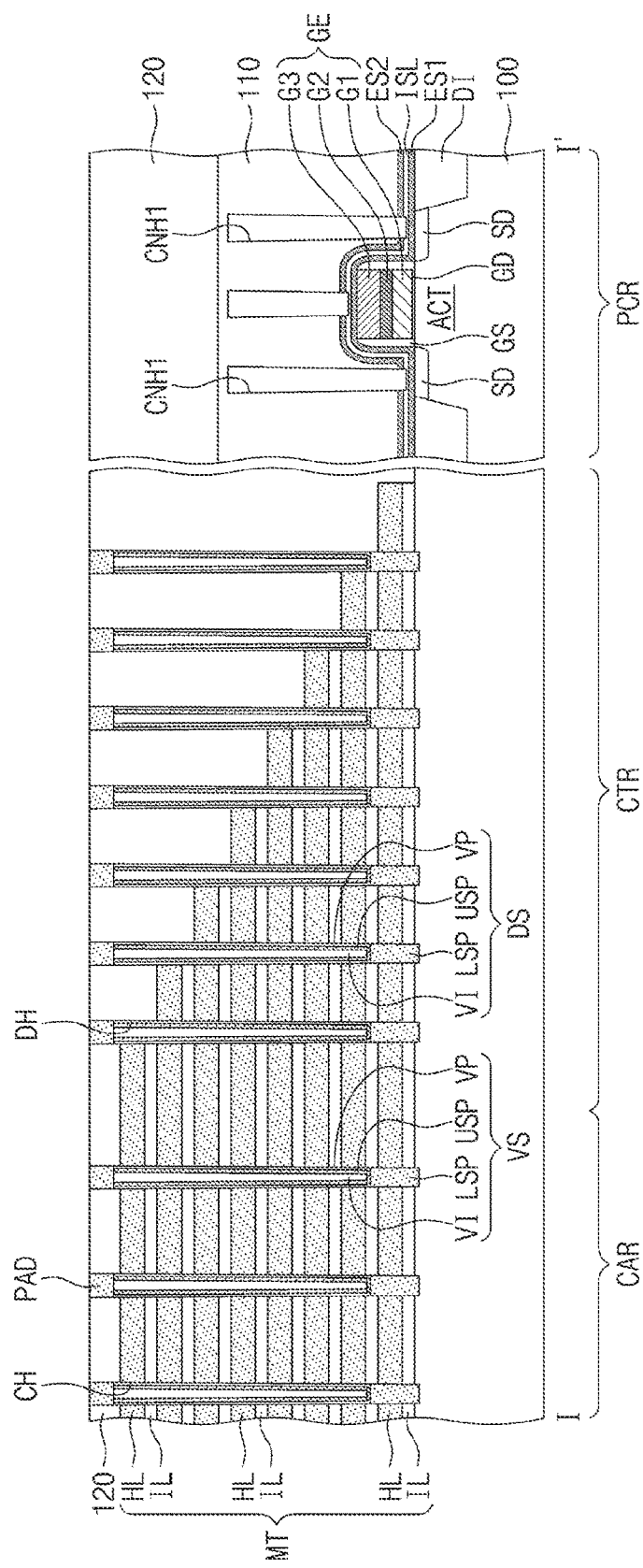

Referring to FIGS. 3 and 12, vertical structures VS may be formed in the channel holes CH, and dummy structures DS may be formed in the dummy holes DH. In some embodiments, the vertical structures VS and the dummy structures DS may be formed at the same time.

In detail, lower semiconductor patterns LSP may be formed on the substrate 100 exposed through the channel holes CH and the dummy holes DH. The lower semiconductor patterns LSP may fill lower portions of the channel holes CH and lower portions of the dummy holes DH. The lower semiconductor patterns LSP may be formed by a selective epitaxial growth process in which the substrate 100 exposed through the channel holes CH and the dummy holes DH are used as seed layers.

A vertical insulation layer VP and an upper semiconductor pattern USP may be formed to sequentially cover an inner sidewall of each of the channel and the dummy holes CH and DH. Each of the vertical insulation layer VP and the upper semiconductor pattern USP may be formed using atomic layer deposition (ALD) or chemical vapor deposition (CVD). A buried insulation pattern VI may be formed to completely fill each of the channel and dummy holes CH and DH. Pads PAD may be formed at or on upper portions of the vertical and dummy structures VS and DS.

Figure 13:
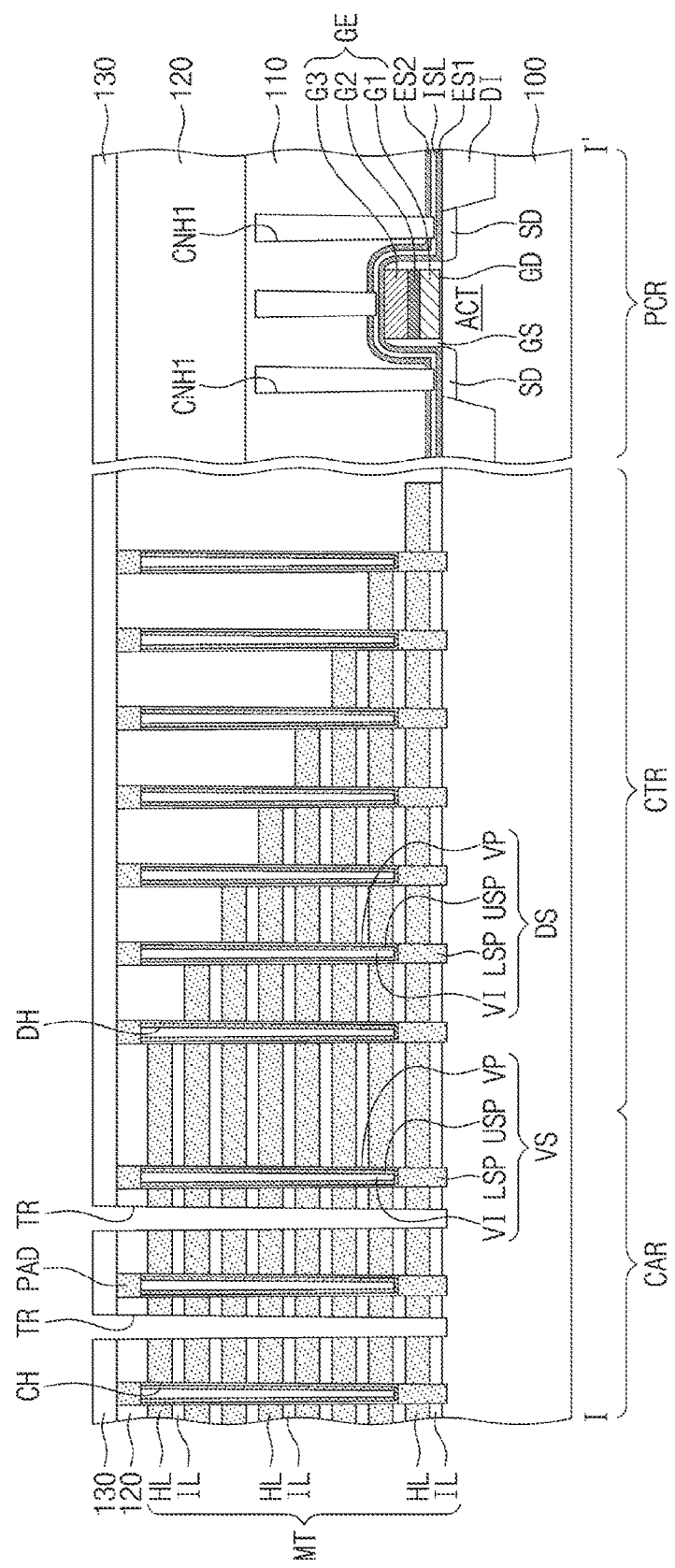

Referring to FIGS. 3 and 13, a third interlayer dielectric layer 130 may be formed on the second interlayer dielectric layer 120. A patterning process may be performed to transform the mold structure MT into a plurality of horizontally spaced mold structures MT. The mold structures MT may be arranged along a first direction D1, while extending along a second direction D2. A trench TR may be defined between a pair of neighboring mold structure MT. The trenches TR may partially expose the substrate 100. The trenches TR may extend in the second direction D2 along the mold structures MT.

Figure 14:
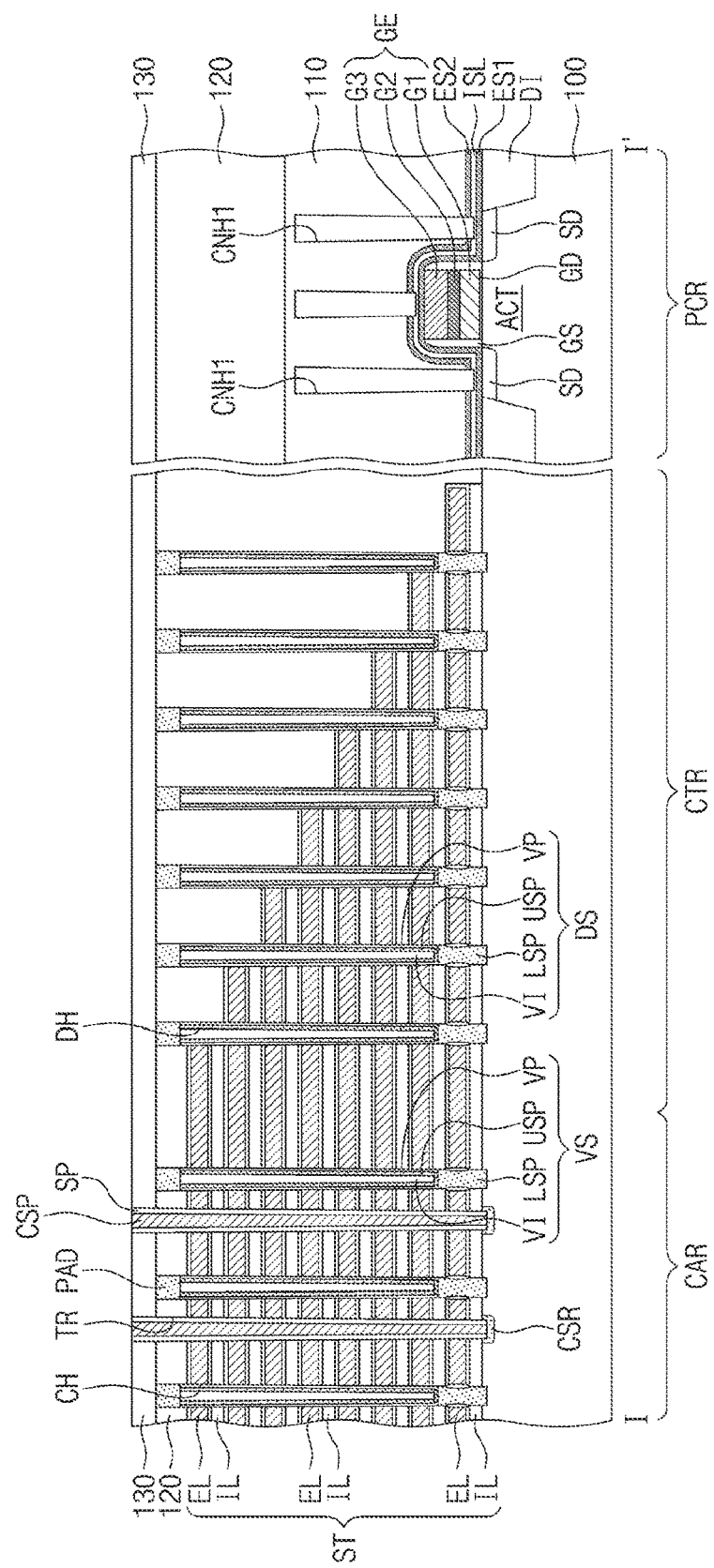

Referring to FIGS. 3 and 14, the sacrificial layers HL may be replaced with electrodes EL to form stack structures ST. Each of the stack structures ST may include the insulation layers IL and the electrodes EL that are vertically and alternately stacked. In detail, a selective removal may be performed on the sacrificial layers HL exposed through the trenches TR, and the electrodes EL may be formed in spaces where the sacrificial layers HL are removed. Before the electrodes EL are formed, horizontal insulation layers HP may be conformally formed in the spaces where the sacrificial layers HL are removed (see FIG. 5). The electrodes EL may be formed to completely fill the spaces where the sacrificial layers HL are removed.

An impurity may be doped into the substrate 100 exposed through the trenches TR to form common source regions CSR. An insulation spacer SP and a common source plug CSP may be formed to sequentially fill each of the trenches TR. The common source plug CSP may be coupled to the common source region CSR.

Figure 15:
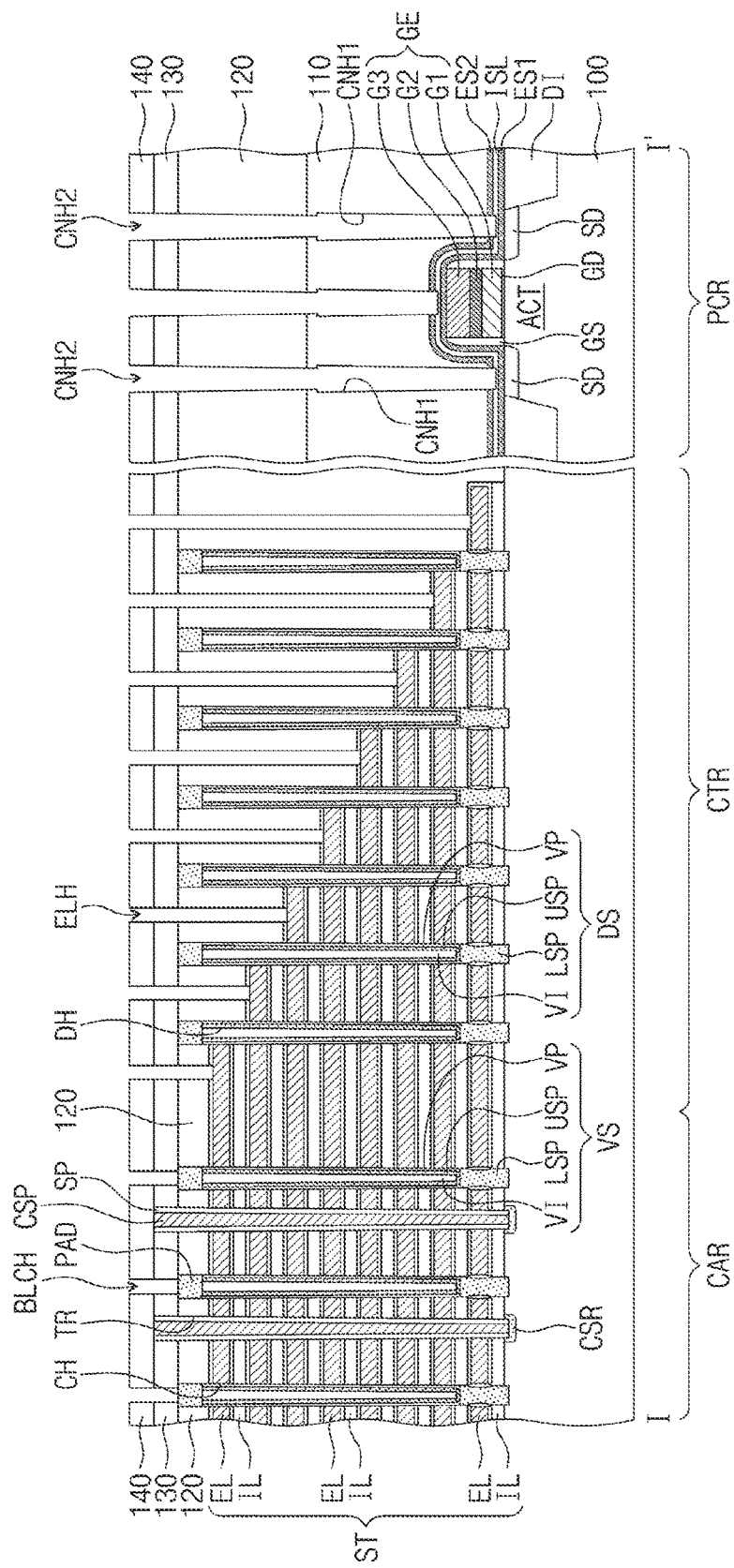

Referring to FIGS. 3 and 15, a fourth interlayer dielectric layer 140 may be formed on the third interlayer dielectric layer 130. On the cell array region CAR, bit line contact holes BLCH may be formed to expose the pads PAD. On the connection region CTR, cell contact holes ELH may be formed to expose the electrodes EL of the stack structures ST.

On the peripheral circuit region PCR, second contact holes CNH2 may be formed to vertically overlap the first contact holes CNH1. Each of the second contact holes CNH2 may be spatially connected to one of the first contact holes CNH1 to constitute a single contact hole. The buffer layer ISL and the first etch stop layer ES1 remaining below the first contact holes CNH1 may be etched when the second contact holes CNH2 are formed. That is, floor surfaces of the first contact holes CNH1 may sink toward the substrate 100. The first and second contact holes CNH1 and CNH2 may expose the source/drain regions SD and the peripheral gate electrode GE.

Each of the second contact holes CNH2 may be formed to have a diameter that gradually increases with increasing distance (e.g., in the third direction D3) from the substrate 100. For example, an upper portion of the first contact hole CNH1 may have a diameter greater than that of a lower portion of the second contact hole CNH2 (see FIG. 6).

In some embodiments, the bit line contact holes BLCH, the cell contact holes ELH, and the second contact holes CNH2 may be formed at the same time. In other embodiments, the bit line contact holes BLCH, the cell contact holes ELH, and the second contact holes CNH2 may be separately formed in different processes from each other.

Referring to FIGS. 3 and 4, the bit line contact holes BLCH, the cell contact holes ELH, and the second contact holes CNH2 may be filled with a conductive material to respectively form bit line contact plugs BPLG, cell contacts CP, and peripheral contacts MC. The bit line contact plugs BPLG, the cell contacts CP, and the peripheral contacts MC may include the same conductive material. The conductive material may include one or more of metal, conductive metal nitride, and transition metal.

Bit lines BL, first electrical lines CL1, and second electrical lines CL2 may be formed on the fourth interlayer dielectric layer 140. The bit lines BL may be electrically connected to the bit line contact plugs BPLG, the first electrical lines CL1 may be electrically connected to the cell contacts CP, and the second electrical lines CL2 may be electrically connected to the peripheral contacts MC.

For a method of fabricating a three-dimensional semiconductor memory device according to some example embodiments of inventive concepts, the formation of the peripheral contact MC may include a process for forming the first contact hole CNH1 and a process for forming the second contact hole CNH2 vertically overlapping the first contact hole CNH1. In case that the peripheral contact MC is formed using a single process for forming a contact hole, the source/drain region SD may not be exposed through the contact hole such that no connection may be made between the peripheral contact MC and the source/drain region SD. This may be because that, since the fourth interlayer dielectric layer 140 has a top surface at a relatively high level from the substrate 100, the contact hole may not be formed deep enough to expose the source/drain regions SD. For a fabrication method according to embodiments of the present inventive concept, since the first and second contact holes CNH1 and CNH2 are separately formed, it may be possible to limit and/or prevent a disconnection between the source/drain region SD and the peripheral contact MC.

Figure 16:
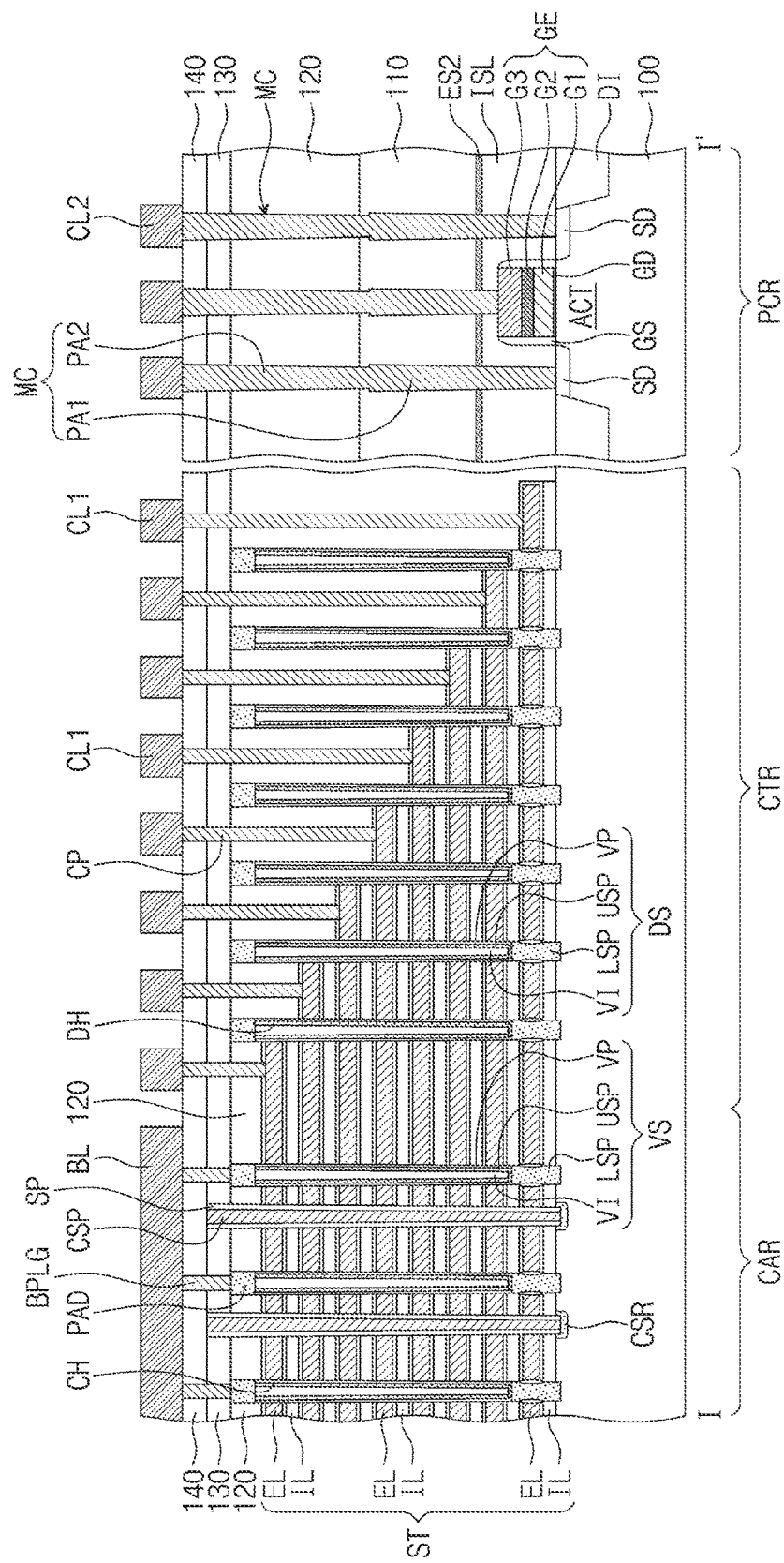
FIGS. 16 and 17 are cross-sectional views taken along line I-I' of FIG. 3 for explaining a three-dimensional semiconductor memory device according to some example embodiments of inventive concepts.
Figure 17:
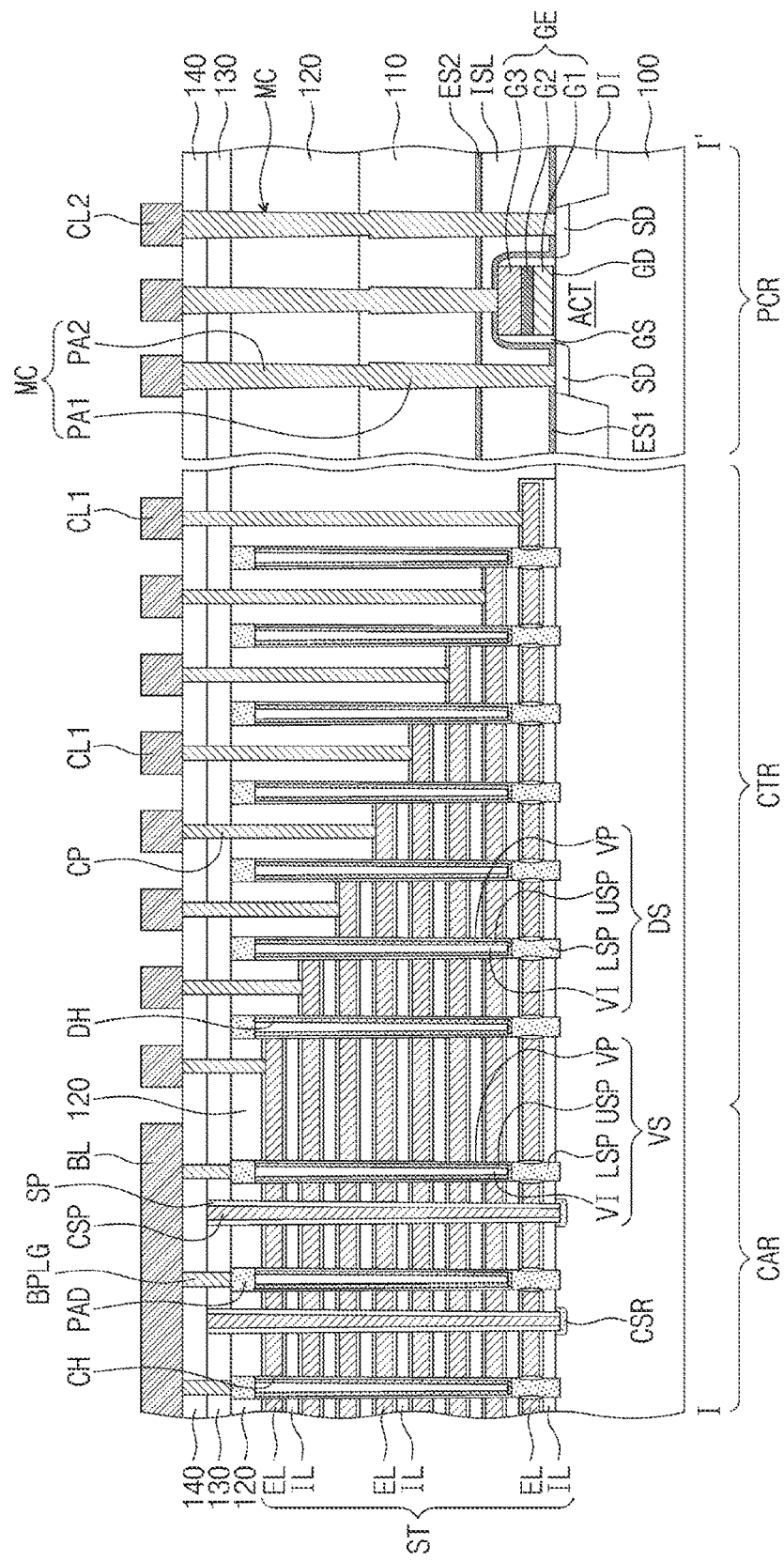

FIGS. 16 and 17 are cross-sectional views taken along line I-I' of FIG. 3 for explaining a three-dimensional semiconductor memory device according to some example embodiments of inventive concepts. In the embodiments that follow, a detailed description of technical features repetitive to those discussed above with reference to FIGS. 3 to 6 will be omitted and differences will be discussed in detail.

In some embodiments, referring to FIGS. 3 and 16, it may be possible to omit the formation of the first etch stop layer ES1 discussed above with reference to FIGS. 3 to 6. The peripheral circuit region PCR may be sequentially provided thereon with the buffer layer ISL and the second etch stop layer ES2. The buffer layer ISL may cover the peripheral gate electrode GE, the gate spacers GS, and the source/drain regions SD. The buffer layer ISL may have a planarized top surface. The top surface of the buffer layer ISL may be closer to a top surface of the peripheral gate electrode GE than to top surfaces of the source/drain regions SD.

In other embodiments, referring to FIGS. 3 and 17, the buffer layer ISL may have a planarized top surface. The first etch stop layer ES1 may have a top surface, whose level is higher on the peripheral gate electrode GE than on the source/drain regions SD. In contrast, the second etch stop layer ES2 may have a top surface, whose level is substantially the same regardless of whether the second etch stop layer ES2 is placed on either the peripheral gate electrode GE or the source/drain region SD.

For a three-dimensional semiconductor memory device according to some example embodiments of inventive concepts, it may be possible to limit and/or prevent a disconnection between the peripheral contact on the peripheral circuit region and the source/drain region.

Although some example embodiments have been described, it will be understood to those skilled in the art that various changes and modifications may be made without departing from the scope and spirit of the claims.

What is claimed is:

1. A three-dimensional (3D) semiconductor memory device, comprising:
   a substrate;
   a stack structure on the substrate, the stack structure including electrodes that are vertically stacked on top of each other on a first region of the substrate;
   a vertical structure penetrating the stack structure, the vertical structure including a first semiconductor pattern;
   a data storage layer between the first semiconductor pattern and at least one of the electrodes;
   a transistor on a second region of the substrate;
   a first contact coupled to the transistor, the first contact including a first portion and a second portion on the first portion,
   each of the first portion and the second portion having a diameter that increases with an increasing vertical distance from the substrate, and
   a diameter of an upper part of the first portion being greater than a diameter of a lower part of the second portion; and
   a dummy structure on a third region of the substrate, wherein
   the stack structure extends onto the third region of the substrate and has a stepwise structure on the third region, and
   the dummy structure penetrates the stack structure on the third region.

2. The 3D semiconductor memory device of claim 1, further comprising:
   a second contact coupled to the at least one of the electrodes of the stack structure,
   wherein the second contact has a sidewall having a continuous profile.

3. The 3D semiconductor memory device of claim 1, wherein the first contact has a sidewall having a stepwise profile at an interface between the first portion and the second portion.

4. The 3D semiconductor memory device of claim 1, wherein
   the transistor includes an active region and a gate electrode on the active region,
   the active region of the transistor has a source/drain region, and
   the first contact contacts a corresponding one of the source/drain region and the gate electrode.

5. The 3D semiconductor memory device of claim 1, further comprising:
   a buffer layer on the second region, and
   an etch stop layer on the buffer layer, wherein
   the buffer layer covers the transistor, and
   the first contact penetrates the etch stop layer and the buffer layer.

6. The 3D semiconductor memory device of claim 5, wherein
   the transistor includes a gate electrode and a source/drain region, and
   a top surface of the etch stop layer is at a higher level on the gate electrode of the transistor than on the source/drain region of the transistor.

7. The 3D semiconductor memory device of claim 5, wherein the buffer layer has a planarized top surface.

8. The 3D semiconductor memory device of claim 1, wherein the stack structure does not extend onto the second region.

9. The 3D semiconductor memory device of claim 1, wherein the second region is one of a row decoder region, a page buffer region, a column decoder region, and a control circuit region.

10. A three-dimensional (3D) semiconductor memory device, comprising:
    a substrate;
    a stack structure on the substrate, the stack structure including electrodes that are vertically stacked on top of each other on a first region of the substrate;
    a channel structure penetrating the stack structure;
    a transistor on a second region of the substrate;
    an interlayer dielectric layer on the stack structure and the transistor;
    a first contact penetrating the interlayer dielectric layer, the first contact coupled to the transistor, a sidewall of the first contact having a stepwise profile;
    a second contact penetrating the interlayer dielectric layer, the second contact coupled to at least one of the electrodes of the stack structure, and a sidewall of the second contact having a continuous profile; and
    a buffer layer on the second region; and
    an etch stop layer on the buffer layer, wherein
    the buffer layer covers the transistor,
    the buffer layer and the etch stop layer are between the interlayer dielectric layer and the transistor, and
    the first contact penetrates the etch stop layer and the buffer layer.

11. The 3D semiconductor memory device of claim 10, wherein the first contact includes a first portion and a second portion on the first portion, and a diameter of an upper part of the first portion is greater than a diameter of a lower part of the second portion.

12. The 3D semiconductor memory device of claim 10, wherein the first contact and the second contact include a same conductive material.

13. The 3D semiconductor memory device of claim 10, wherein top surfaces of the second contact, the first contact, and the interlayer dielectric layer are coplanar with each other.

14. A three-dimensional (3D) semiconductor memory device, comprising:
 a substrate including a cell array region and a peripheral circuit region;
 a stack structure on the cell array region, the stack structure including a memory cell array having a plurality of memory cells that are vertically stacked, the stack structure including word lines electrically connected to the plurality of memory cells;
 a transistor on the peripheral circuit region;
 a first contact electrically connected to the transistor;
 a second contact electrically connected to the stack structure, a sidewall of the second contact having a different profile than a sidewall of the first contact; and
 a first etch stop layer on the peripheral circuit region; and
 a second etch stop layer on the first etch stop layer, wherein
 the first etch stop layer covers the transistor,
 the first etch stop layer and the second etch stop layers each independently include at least one of a silicon nitride layer, a silicon oxynitride layer, or a polysilicon layer, and
 the first contact penetrates the first etch stop layer and the second etch stop layer.

15. The 3D semiconductor memory device of claim 14, wherein the second contact is coupled to at least one of the word lines.

16. The 3D semiconductor memory device of claim 14, wherein
 the sidewall of the first contact has a stepwise profile, and
 the sidewall of the second contact has a continuous profile.

17. The 3D semiconductor memory device of claim 14, wherein a maximum diameter of the first contact is greater than a maximum diameter of the second contact.

* * * * *